United States Patent
Gill et al.

(10) Patent No.: US 12,232,427 B2
(45) Date of Patent: Feb. 18, 2025

(54) SUPERCONDUCTING QUBIT CAPACITANCE AND FREQUENCY OF OPERATION TUNING

(71) Applicant: INTERNATIONAL BUSINESS MACHINES CORPORATION, Armonk, NY (US)

(72) Inventors: Douglas M. Gill, South Orange, NJ (US); Martin O. Sandberg, Ossining, NY (US); Vivekananda P. Adiga, Ossining, NY (US); Jason S. Orcutt, Katonah, NY (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/063,722

(22) Filed: Dec. 9, 2022

(65) Prior Publication Data
US 2023/0320236 A1 Oct. 5, 2023

Related U.S. Application Data

(62) Division of application No. 16/752,146, filed on Jan. 24, 2020, now Pat. No. 11,552,236.

(51) Int. Cl.
*G06N 10/00* (2022.01)
*H10N 60/12* (2023.01)
(Continued)

(52) U.S. Cl.
CPC ............ *H10N 60/805* (2023.02); *G06N 10/00* (2019.01); *H10N 60/12* (2023.02); *B82Y 10/00* (2013.01)

(58) Field of Classification Search
CPC ... H01L 39/025; H01L 39/223; H01L 39/045; H01L 27/18; G06N 10/00; B82Y 10/00
See application file for complete search history.

(56) References Cited

U.S. PATENT DOCUMENTS

| 5,351,163 A | 9/1994 | Dawson et al. |
| 7,939,909 B2 | 5/2011 | Lee et al. |
| (Continued) | | |

FOREIGN PATENT DOCUMENTS

| EP | 0 545 816 A2 | 6/1993 |
| WO | 2017/116439 A1 | 7/2017 |

OTHER PUBLICATIONS

Schönenberger, C. 2D materials shrink superconducting qubits. Nat. Mater. 21, 381-382 (2022). https://doi.org/10.1038/s41563-022-01220-6 (Year: 2022).*

(Continued)

*Primary Examiner* — Jarrett J Stark
(74) *Attorney, Agent, or Firm* — Amin, Turocy & Watson, LLP (57) ABSTRACT

A method for adjusting a resonance frequency of a qubit in a quantum mechanical device includes providing a substrate having a frontside and a backside, the frontside having at least one qubit formed thereon, the at least one qubit comprising capacitor pads; and removing substrate material from the backside of the substrate at an area opposite the at least one qubit to alter a capacitance around the at least one qubit so as to adjust a resonance frequency of the at least one qubit.

18 Claims, 10 Drawing Sheets

(51) Int. Cl.
*H10N 60/80* (2023.01)
*B82Y 10/00* (2011.01)

(56) References Cited

U.S. PATENT DOCUMENTS

| | | | |
|---|---|---|---|
| 8,735,326 | B2 | 5/2014 | Folk et al. |
| 9,971,970 | B1 | 5/2018 | Rigetti et al. |
| 10,340,438 | B2 | 7/2019 | Rosenblatt et al. |
| 10,355,193 | B2 | 7/2019 | Rosenblatt et al. |
| 10,930,836 | B2 * | 2/2021 | Megrant ................ H01P 3/003 |
| 2015/0372217 | A1 | 12/2015 | Schoelkopf, III et al. |
| 2017/0072504 | A1 | 3/2017 | Abraham et al. |
| 2019/0158058 | A1 | 5/2019 | Shealy |
| 2019/0165238 | A1 | 5/2019 | Rosenblatt et al. |
| 2019/0165244 | A1 | 5/2019 | Hertzberg et al. |
| 2019/0165245 | A1 | 5/2019 | Rosenblatt et al. |
| 2020/0127187 | A1 * | 4/2020 | Megrant ................ H10N 60/85 |
| 2020/0335686 | A1 * | 10/2020 | Shao ....................... G06N 10/00 |
| 2021/0234085 | A1 * | 7/2021 | Gill ........................ G06N 10/00 |

OTHER PUBLICATIONS

Barends, R. (2013). Coherent Josephson qubit suitable for scalable quantum integrated circuits. Physical Review Letters, 111(8). https://doi.org/10.1103/physrevlett.111.080502 (Year: 2013).*
Brecht et al., "Demonstration of superconducting micromachined cavities", Applied Physics Letters, vol. 107, No. 192603, 2015, 5 pages.
PCT/EP2021/050180 International Search Report completed Apr. 13, 2021, 4 pages.
PCT/EP2021/050180 Written Opinion completed Apr. 13, 2021, 7 pages.
Non Final Office Action received for U.S. Appl. No. 16/752,146 dated Jan. 13, 2022, 25 pages.
"Orientation Dependent Etching of Silicon", Springer Science & Business Media, Dec. 5, 2005, 53 pages.

* cited by examiner

Provide substrate 202 having frontside 202A and backside 202B. The frontside 202A has at least one qubit (qubit 1, qubit 2, qubit 3) formed thereon. The at least one qubit (qubit 1, qubit 2, qubit 3) includes capacitor pads 104A, 104B. ~S602

Remove substrate material from the backside 202B of the substrate 202 at an area opposite the at least one qubit (qubit 1, qubit 2, qubit 3) to alter a capacitance around the at least one qubit (qubit 1, qubit 2, qubit 3) so as to adjust a resonance frequency of the at least one qubit (qubit 1, qubit 2, qubit 3) ~S604

SUPERCONDUCTING QUBIT CAPACITANCE AND FREQUENCY OF OPERATION TUNING

BACKGROUND

The currently claimed embodiments of the present invention relate to superconducting quantum mechanical devices, and more specifically, to a method for adjusting a resonance frequency of a qubit in a quantum mechanical device and a quantum mechanical device having one or more frequency adjusted qubits.

In superconducting quantum computing systems the frequencies of operation of individual qubits within the computing circuitry are controlled or set for proper operation. Unfortunately, Josephson junction (JJ) resistance in superconducting qubits can be difficult to precisely control. Therefore, there is a detrimental amount of variability in qubit JJ resistance that manifests itself as variability in the resonance frequency of operation in individual qubits. The resonance frequency of a qubit depends on impedance of the device, i.e., on both capacitance and resistance of the device. Methods have been developed to adjust qubit frequency after chip fabrication through the modification of the JJ resistance. However, the accuracy of predicting what modifications are needed to properly align or set qubit frequency is not sufficient to consistently avoid all possible frequency collisions in larger systems, for example. As a result, detrimental frequency collisions still occur in superconducting qubit systems after chips have been packaged and/or flip chip bump bonded for use.

Therefore, providing a method to modify Qubit frequency of operation after chips have been flip chip bonded can lead to a significant advantage in the deployment of larger quantum computing systems, since the parameters of operation can be brought into fine-tuned performance after packaging is achieved. Conventionally, qubit performance specifications have been modified via front side etching. However, front side etching is not desirable because (i) it significantly perturbs the qubit where electromagnetic (e.g., microwave or radiofrequency) field strengths are very strong, (ii) the front side etching cannot be performed once a chip is flip chip bump bonded without de-bonding the chip to do further processing, and (iii) the bump bonding process itself could have an influence on final qubit performance metrics.

SUMMARY

An aspect of the present invention is to provide a method for adjusting a resonance frequency of a qubit in a quantum mechanical device. The method includes providing a substrate having a frontside and a backside, the frontside having at least one qubit formed thereon, the at least one qubit having capacitor pads. The method further includes removing substrate material from the backside of the substrate at an area opposite the at least one qubit to alter a capacitance around the at least one qubit so as to adjust a resonance frequency of the at least one qubit.

In an embodiment, removing the substrate material from the backside of the substrate at the area opposite the at least one qubit includes chemically etching the backside of the substrate selectively using a chemical etchant selected depending on the substrate material.

In an embodiment, prior to chemically etching the backside of the substrate, forming an initial cavity in the backside of the substrate in a vicinity of the at least one qubit by mechanically removing material from the backside of the substrate and then chemically etching the backside of the substrate at the formed initial cavity. In an embodiment, forming the initial cavity in the backside of the substrate includes defining faces of the initial cavity having one or more first crystal planes and one or more second crystal planes so that the chemical etchant preferentially etches the substrate material from the one or more first crystal planes while substantially not etching substrate material from the one or more second crystal planes to form an etched final cavity in the vicinity of the at least one qubit. In an embodiment, the substrate material is silicon and the one or more first crystal planes has a (111) plane and the one or more second crystal planes has a (100) plane.

In an embodiment, the method further includes controlling an amount of the substrate material etched by selecting a size and shape of the initial cavity so that the etching of the substrate material stops when the one or more first crystal planes are substantially eliminated so as to form size self-limited etched final cavities. In an embodiment, controlling the amount of material etched includes controlling an etching depth of the etched final cavities from the backside to the frontside.

In an embodiment, removing the substrate material from the backside of the substrate at the area opposite the at least one qubit includes applying an etch mask film to the backside of the substrate and etching selected areas at the backside of the substrate opposite the at least one qubit. In an embodiment, subsequent to applying the etch film mask to the backside of the substrate and prior to etching the selected areas at the backside of the substrate, forming one or more openings in the etch film mask at the selected areas. In an embodiment, forming the one or more openings in the etch film mask includes forming the one or more openings using a focused ion beam etching, laser ablation, or mechanical milling, or any combination thereof.

In an embodiment, the method further includes disposing a chemical etchant container to define an area around the one or more openings in the etch film mask and providing a wet or dry etching chemical to remove substrate material from the defined area at the one or more openings in the etch film mask to form one or more cavities at the backside of the substrate.

In an embodiment, removing the substrate material from the backside of the substrate at the area opposite the at least one qubit includes removing material using laser ablation, mechanical milling, focused ion beam, or any combination thereof.

In an embodiment, removing substrate material from the backside of the substrate at an area opposite the at least one qubit includes removing the substrate material from the backside of the substrate at a plurality of areas opposite to a plurality of qubits to form a plurality of cavities on the backside of the substrate. In an embodiment, the removing of the substrate material from the backside of the substrate at the plurality of areas opposite to the plurality of qubits includes removing the substrate material from the backside of the substrate at the plurality of areas opposite to the plurality of qubits substantially simultaneously using a global substrate etch process. In an embodiment, the global etch process includes applying a chemical etch process.

In an embodiment, the method further includes controlling an amount of material etched by selecting a size and shape of a formed initial cavity for each of the plurality of areas so that the etching of the substrate material stops at different times depending upon a selected geometry or shape of the initial opening. In an embodiment, forming the initial cavity includes defining faces of the initial cavity having one or more first crystal planes and one or more second crystal planes in the substrate material so that the substrate material is etched from the one or more first crystal planes while substantially not etched from the one or more second crystal planes.

Another aspect of the present invention is to provide a quantum mechanical device including a substrate having a frontside and a backside; and a plurality of qubits formed on the frontside of the substrate, the plurality of qubits including a plurality of capacitor pads. The substrate includes one or more cavities formed on the backside of the substrate opposite one more qubits of the plurality of qubits. A size or a shape, or both, of the one or more cavities are selected to alter a capacitance around the one or more of qubits so as to adjust a resonance frequency of the one or more qubits.

In an embodiment, the substrate can be made, for example, from silicon, high resistivity silicon, or sapphire. In an embodiment, the plurality of capacitor pads are made from a superconducting material. In an embodiment, the superconducting material can be aluminum (Al) or niobium (Nb). In an embodiment, the resonance frequency of the one or more qubits is adjusted by 0.2% to 20%. In an embodiment, the resonance frequency of each of the one or more qubits is adjusted by a different amount depending on the size or the shape, or both, of the one or more cavities.

The above method provides an alternate solution to mitigating frequency collision in superconducting qubit systems by etching the substrate from the backside of the device. Backside etching of the qubits not only provides an alternate approach to tuning qubit frequency of operation, but it also enables frequency tuning of a qubit chip that has been flip chip bonded without having to de-bond the qubit subsystem to fine tune the chip for proper operation. Backside etching of qubits also allows wafer/substrate scale processing while minimally perturbing the qubit environment and junction inductance by making substrate modifications that are in regions where the radiofrequency (RF) field is weakest, but can still have an appropriate and desired impact on device performance.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figures 1A, 1B:
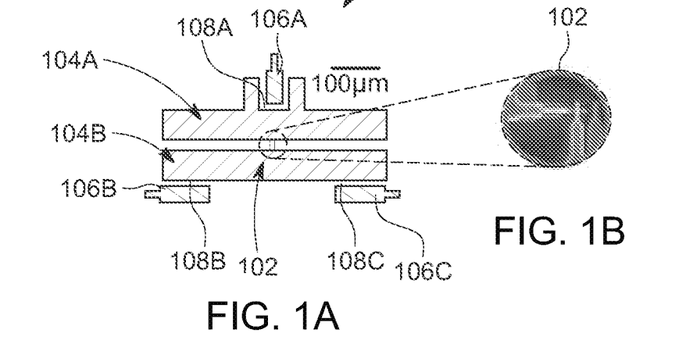
FIG. 1A is a schematic cross-section view of a qubit device, according to an embodiment of the present invention.
FIG. 1B is an Electron Microscope (EM) image of a Josephson junction, according to an embodiment of the present invention.

FIG. 1A is a schematic cross-section view of a qubit device 100, according to an embodiment of the present invention. As shown in FIG. 1A, the qubit device 100 comprises Josephson junction 102 and capacitor pads 104A and 104B. The Josephson junction 102 is connected to capacitor pads 104A and 104B. The capacitor pads 104A and 104B can be in turn capacitively coupled to electromagnetic (e.g., microwave or radiofrequency) signal lines 106A, 106B and 106C via capacitors 108A, 108B and 108C, for example.

Figure 1C:
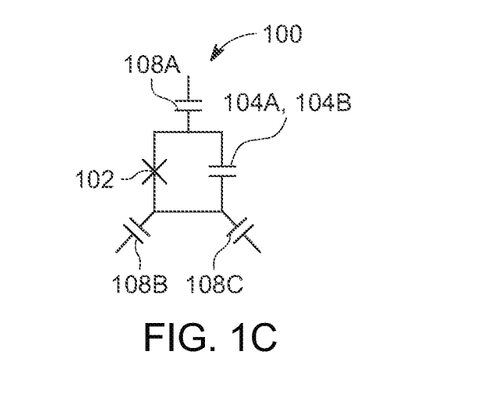
FIG. 1C is an electronic circuit diagram of the qubit device coupled to electromagnetic signal lines via capacitors, according to an embodiment of the present invention.

FIG. 1B is an Electron Microscope (EM) image of the Josephson junction, according to an embodiment of the present invention. In an embodiment, the Josephson junction can have a size of about 100 by 100 $nm^2$. FIG. 1C is an electronic diagram of the qubit device 100 coupled to electromagnetic signal lines via capacitors 108A, 108B and 108C, according to an embodiment of the present invention. The Josephson junction 102 has an internal capacitance $C_j$ and internal inductance $L_j$ (for example, $L_j$ is about 20 nH and $C_j$ is about 1 fF). However, as it must be appreciated, the internal inductance $L_j$ and internal capacitance $C_j$ of the Josephson junction can have other values depending on the construction of the Josephson junction 102. In addition to the Josephson junction internal capacitance $C_j$, the qubit 100 also has a coupling capacitance or signal capacitance $C_s$ due to capacitor pads 104A and 104B. In an embodiment, the capacitance $C_s$ (from capacitor pads 104A and 104B) can be about 60 fF. However, the capacitance $C_s$ can also have other values depending on the size, geometry or shape of the capacitor pads 104A and 104B.

In an embodiment, the resonance frequency is determined by the capacitive and resistive contributions from both the Josephson junction (including the internal capacitance $C_j$ and inductance $L_j$) and the associated capacitor $C_s$ from the capacitor pads 104A and 104B. Therefore, for example, a first resonance frequency $f_{01}$ of a qubit depends on the device capacitance and can be expressed mathematically by the following equation (1). The "0" in the index indicates the ground state of the Josephson junction 102 and "1" in the index indicates the first excited state of the Josephson junction 102, for example.

$$f_{01} = \frac{1}{h}\sqrt{8E_jE_c} \quad (1)$$

where energies $E_j$ and $E_c$ can be expressed by the following two equations (2) and (3).

$$E_c = \frac{e^2}{2C_\Sigma} \quad (2)$$

$$E_J = \frac{hI_c}{2e} \quad (3)$$

Where e is the electron charge, h is the Planck constant, $C_\Sigma$ is the sum of all capacitances, and $I_c$ is the critical current (Ambegaokar-Baratoff), given by the following equation (4).

$$I_c = \frac{1}{R_n}\frac{\pi\Delta}{2e} \quad (4)$$

Where $R_n$ is the resistance of the Josephson Junction (JJ), and $\Delta$ is the superconducting energy gap, which is a material property that is independent of the material geometry, where the size of the superconducting energy gap is indicative of the energy gain of two electrons when they form a Cooper pair. The energy gap is temperature dependent and increases with decreasing temperature.

Therefore, by varying the capacitance $C_\Sigma$, which includes the contribution of the capacitance Cs, it is possible to change or vary the resonance frequency (for example, the first resonance frequency $f_{01}$) of the qubit.

Figure 2:
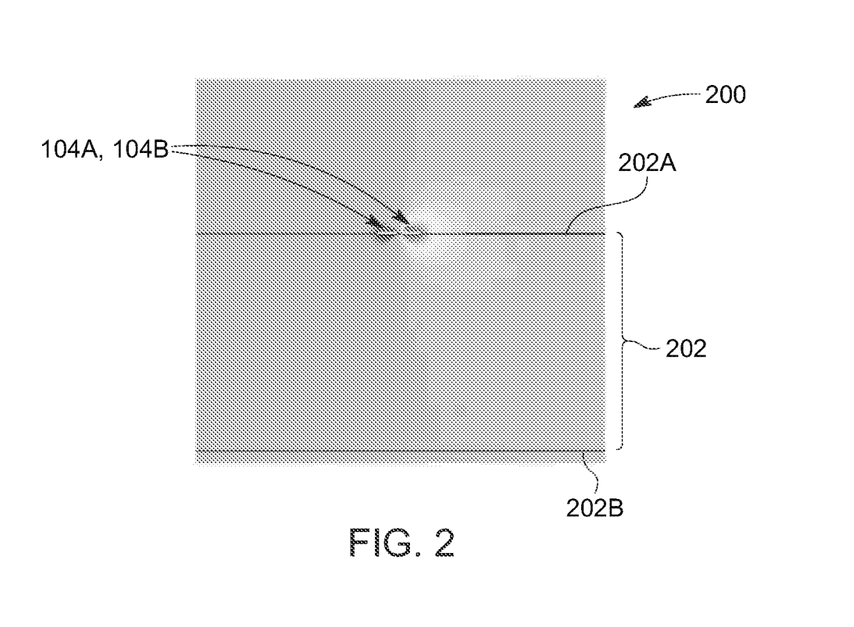
FIG. 2 is a contour map of a simulated two-dimensional electric field generated by capacitor pads connected to the Josephson junction, according to an embodiment of the present invention.

FIG. 2 is a contour map of a simulated two-dimensional electric field generated by the capacitor pads 104A and 104B connected to the Josephson junction 102, according to an embodiment of the present invention. The two capacitor pads 104A and 104B of the qubit 100 are represented as bars in FIG. 2. The Josephson junction 102 (not shown) is located between the two bars 104A and 104B. For example, the left bar corresponding to capacitor pad 104A can be connected to a zero electric potential while the right bar corresponding to capacitor pad 104B can be connected to a higher electric potential (for example, approximately 7 $10^3$ V/m). In FIG. 2, the electric contour map is superposed on a representation of the capacitor pads 104A, 104B which are part of the quantum mechanical device 200. The qubit 100 is also part of the quantum mechanical device 200 which also include a substrate 202. The substrate 202 has frontside 202A and a backside 202B. The capacitor pads 104A and 104B represented as bars in FIG. 2 and the Josephson junction 102 located between the two capacitor pads 104A and 104B of the qubit 100 are located on the frontside 200A of the substrate 202 of the quantum mechanical device 200.

Changes in electric field distribution are indicative of changes in the effective dielectric constant of the substrate 202. The capacitance of the quantum mechanical device 200 is related to the effective dielectric constant of the substrate 202. Changes in the electric field distribution can be implemented by changing a thickness of the substrate 200 at specific locations in the substrate 202. For example, this can be performed by etching the substrate 202 from the backside 202B, i.e., removing substrate material from the backside 202B. Changes in electric field distribution due to etching of the substrate 202 at the backside 202B are indicative of changes in the quantum mechanical device capacitance.

Figure 3A:
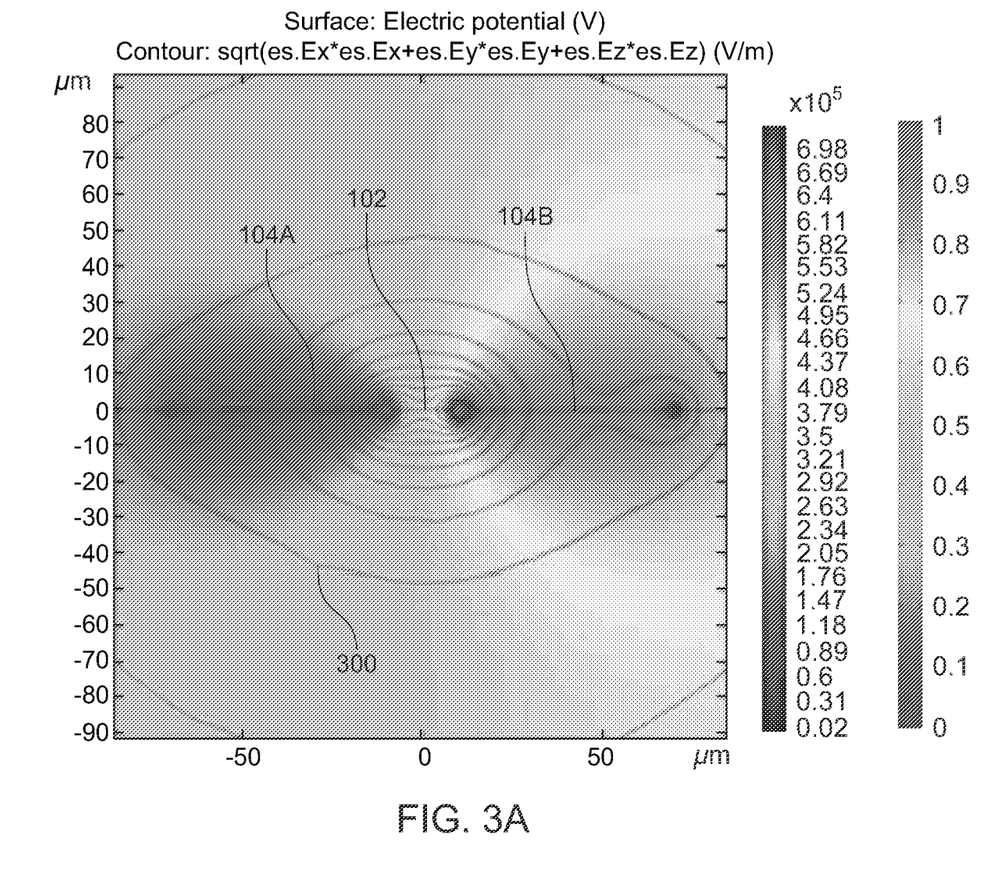
FIGS. 3A-3C are contour maps of a distribution of the electric potential around the capacitor pads, according to embodiments of the present invention.
Figure 3B:
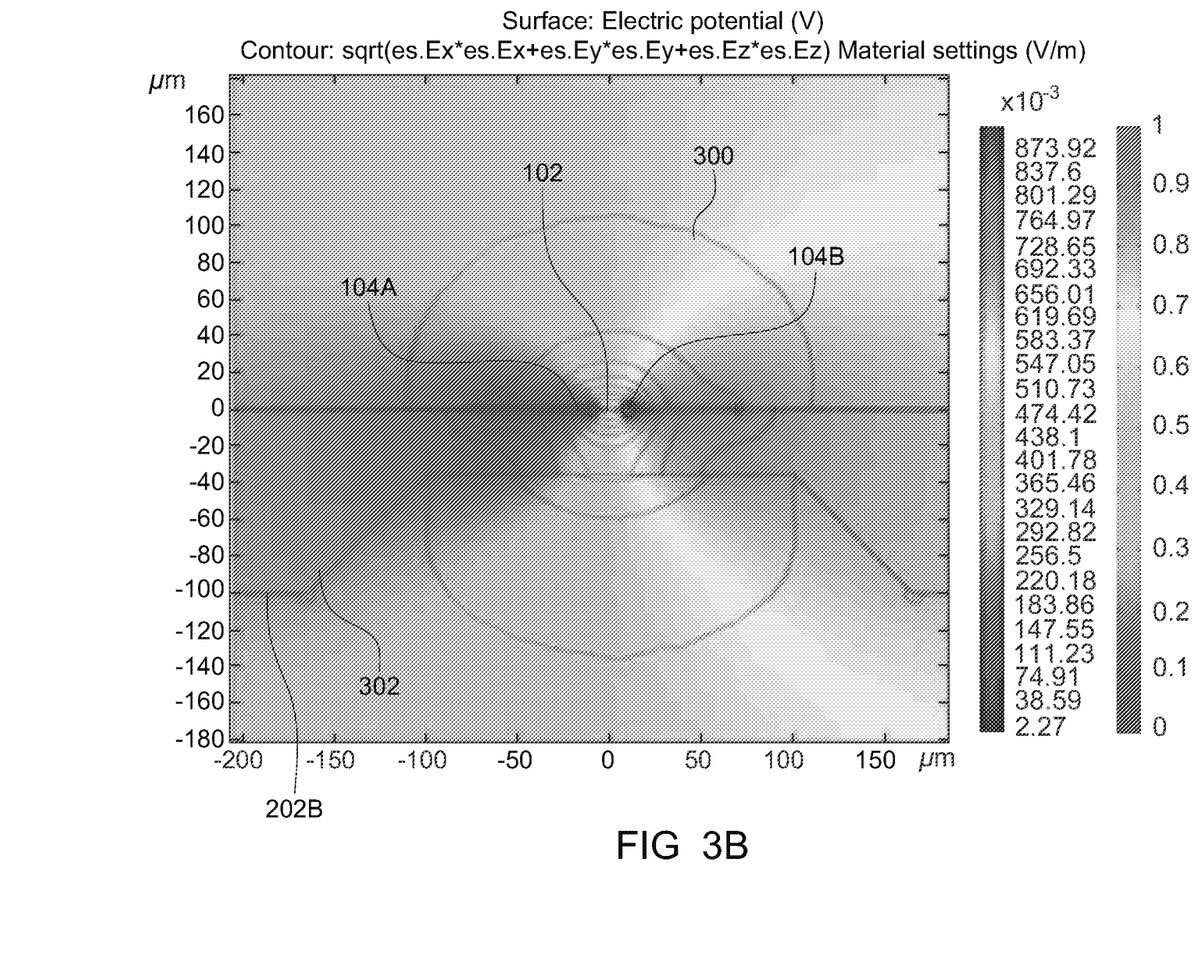
Figure 3C:
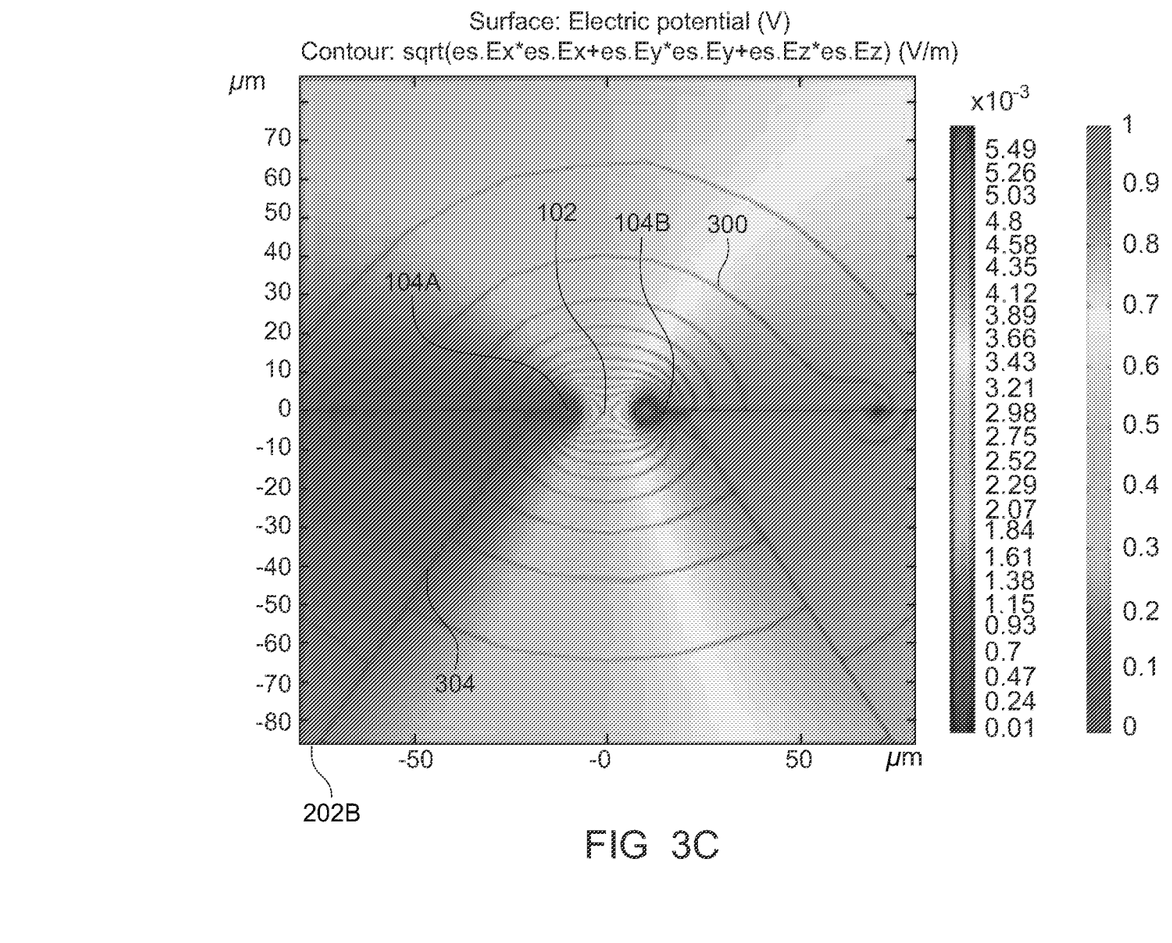

FIGS. 3A-3C are contour maps of a distribution of the electric potential around the capacitor pads 104A and 104B, according to embodiments of the present invention. The electric potential contour lines 300 are drawn around the ends of the capacitor pads 104A and 104B. FIG. 3A shows the distribution the electric potential around the Josephson junction 102 with the backside 202B of the substrate 202 of the device 200 being not etched. Ends of the capacitor pads 104A, 104B can be recognized by the presence of higher concentration of the electric potential (shown generally as circular dots) 300. The Josephson junction 102 is located between an end of capacitor pad 104A and end of capacitor pad 104B.

FIG. 3B shows the distribution of the electric potential around the Josephson junction 102. The Josephson junction 102 is also located between an end of capacitor pad 104A and an end of capacitor pad 104B. However, as shown in FIG. 3B, the backside 202B of the substrate 202 is etched in the vicinity of the Josephson junction 102. The profile of the etched material of the substrate 202 is shown as a trapezoid shape 302 wherein more material is removed in the vicinity of the Josephson junction 102 than away from the Josephson junction 102. The removal of material at the backside 202B of the substrate 202 modifies the shape of electric potential lines 300 and thus the distribution of the electric potential around or in the vicinity of the Josephson junction 102. Therefore, this indicates that the capacitance of the qubit 100 around the Josephson junction 102 and the capacitor pads 104A and 104B is altered.

FIG. 3C shows the distribution of the electric potential around the Josephson junction 102. The Josephson junction 102 is also located between an end of capacitor pad 104A and an end of capacitor pad 104B. As shown in FIG. 3C, the backside 202B of the substrate 202 is etched in the vicinity of the Josephson junction 102 even further in comparison with the etching profile shown in FIG. 3B. The profile of the etched material of the substrate 202 is shown as a trapezoid shape 304 wherein even more material is removed in the vicinity of the Josephson junction 102 in comparison with the trapezoid profile 302 shown in FIG. 3B. The removal of material at the back 202B of the substrate 202 modifies the shape of the electric potential lines 300 and thus the distribution of the electric potential around or in the vicinity of the Josephson junction 102. Therefore, this indicates that the capacitance of qubit around the Josephson junction 102 and the capacitor pads 104A and 104B is altered even further in comparison with FIG. 3B.

Figure 4:
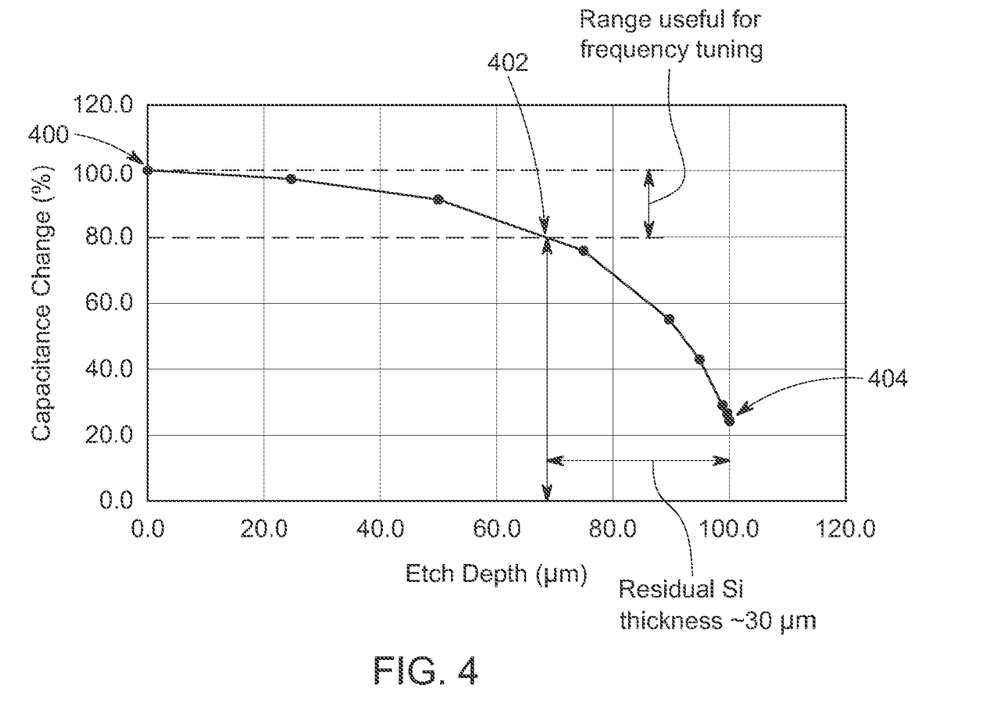
FIG. 4 is a plot of capacitance (in %) versus etch depth (in μm) corresponding to an amount of substrate material removed at a backside of the substrate, according to an embodiment of the present invention.

FIG. 4 is a plot of capacitance (in %) versus etch depth (in μm) corresponding to the amount of substrate material removed at the backside 202B of the substrate 202, according to an embodiment of the present invention. The etch depth point 400 at about 0 μm corresponds to zero etch depth shown in FIG. 3A. The etch depth point 402 at about 70 μm corresponds to the etch depth shown in FIG. 3B. The etch depth point 404 at about 100 μm corresponds to the etch depth shown in FIG. 3C. At etch depth point 400, the capacitance is at 100% corresponding to the capacitance at full value. At etch depth point 402, the capacitance is at about 80%. At etch depth point 404, the capacitance is at about 20%. The capacitance decreases with increasing etch depth. At etch depth point 402, the remaining or residual thickness of the substrate material is about 30 μm. In an embodiment, a range of useful tuning of the frequency of the qubit is provided by a capacitance between about 100% and about 80% (e.g., a change in capacitance between about 0.2% to about 20%). However, it is also contemplated to provide a wider range of frequency tuning by allowing for a wider range of capacitance change, such as between 0.1% and 50%, with the removal of substrate material at depths in the range between for example about 10 μm and about 90 μm. The plot shown in FIG. 4 is provided for a specific type of substrate material in the present case silicon. Therefore, similar plots can also be provided for other types of substrate materials such as sapphire, etc. The curve capacitance vs. etch depth for silicon may be different from the curve capacitance vs. etch depth for sapphire, for example. Therefore, the above numbers for the capacitance and for the etch depth are only provided for illustration purposes to show the variation of capacitance as a function of etch depth.

Figure 5:
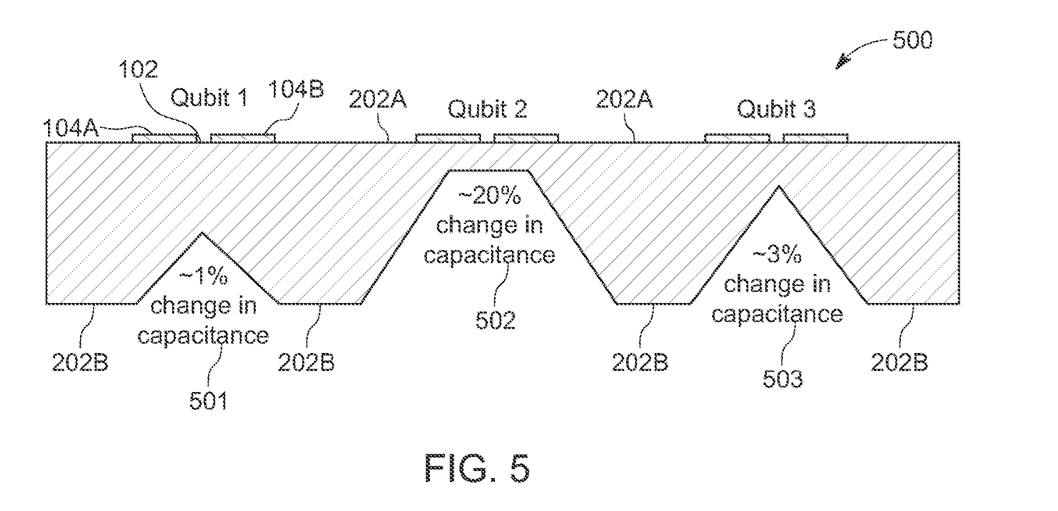
FIG. 5 depicts schematically the concept of varying the capacitance of a plurality of qubits by different amounts by changing the shape and/or depth of a trench or cavity at the backside of the substrate, according to an embodiment of the present invention.
Figure 8:
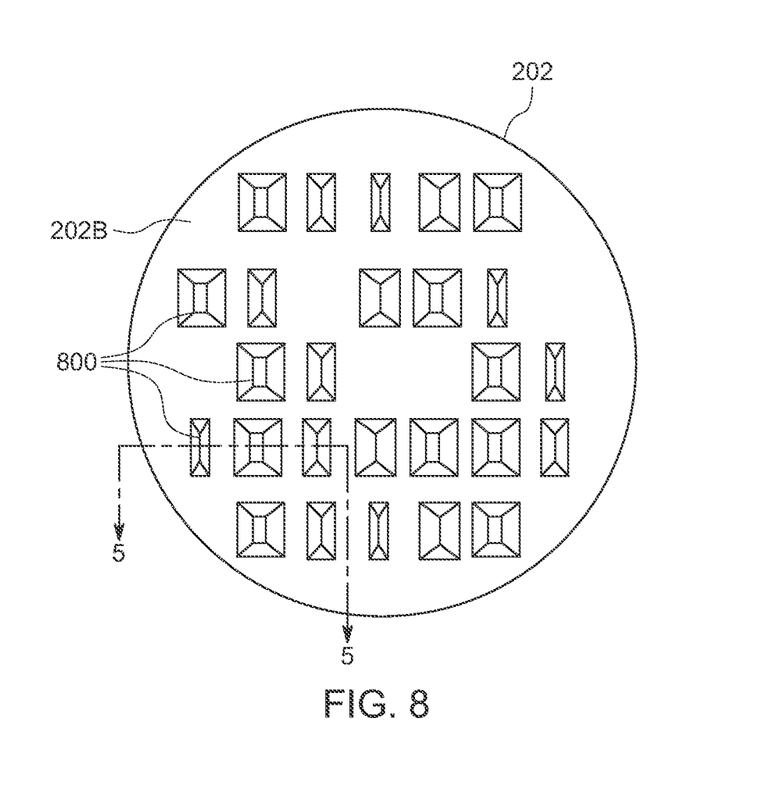
FIG. 8 depicts the backside of the substrate having a plurality of cavities, according to an embodiment of the present invention.

FIG. 5 depicts schematically the concept of varying the capacitance of a plurality of qubits by different amounts by changing the shape and/or depth of a trench or cavity at the backside of the substrate, according to an embodiment of the present invention. FIG. 5 also depicts a cross-section of three cavities in a plurality of cavities formed by etching the backside 202B of the substrate 202 of a quantum mechanical device 500. The cross-section is taken along line 5-5, as shown in FIG. 8. For example, as shown in FIG. 5, a capacitance of a first qubit (qubit 1) of the quantum mechanical device 500 is changed by about 1%, a capacitance of a second qubit (qubit 2) of the quantum mechanical device 500 is changed by about 20%, and a capacitance of a third qubit (qubit 3) of the quantum mechanical device 500 is changed by about 3%. As shown in FIG. 5, the capacitance of the qubit 1 is changed by about 1% by forming a trench or cavity 501 (e.g., a triangular trench) at the backside 202B of the substrate 202 opposite qubit 1 which is located on the frontside 202A of the substrate 202. Similarly, the capacitance of the qubit 3 is changed by about 3% by forming a wider trench or cavity 503 (e.g., a wider triangular trench) wherein more substrate material is removed or etched at the backside 202B of the substrate 202 opposite qubit 3 which is located on the frontside 202A of the substrate 202. The capacitance of the qubit 2 is changed by about 20% by forming an even wider trench or cavity 502 (e.g., a wider trapezoid trench) wherein even more substrate material is removed or etched at the backside 202B of the substrate 202 opposite qubit 2 which is located on the frontside 202A of the substrate 202.

Therefore, as it can be appreciated from the above paragraphs, there is provided the quantum mechanical device 500 having a plurality of qubits (qubit 1, lubit 2, qubit 3) formed on the frontside 202A of the substrate 202. The plurality of qubits (qubit 1, qubit 2, qubit 3) include a plurality of capacitor pads 104A, 104B. The substrate 202 has one or more cavities 501, 502, 503 formed on the backside 202B of the substrate 202 opposite one or more qubits (qubit 1, qubit 2, qubit 3) of the plurality of qubits (qubit 1, qubit 2, qubit 3). A size or a shape, or both, of the one or more cavities 501, 502, 503 are selected to alter a capacitance around the one or more of qubits (qubit 1, qubit 2, qubit 3) so as to adjust a resonance frequency of the one or more qubits (qubit 1, qubit 2, qubit 3).

In an embodiment, the substrate 202 can be for example silicon, high resistivity silicon, or sapphire. In an embodiment, the plurality of capacitor pads 104A, 104B are made from a superconducting material. The superconducting material can be, for example, aluminum (Al), niobium (Nb), etc.

In an embodiment, the resonance frequency of the one or more qubits (qubit 1, qubit 2, qubit 3) can be adjusted by 0.2% to 20%. For example, the resonance frequency of qubit 1 can be adjusted by about 2% by changing a capacitance by about 1%. The resonance frequency of qubit 2 can be adjusted by about 40% by changing a capacitance by about 20%. The resonance frequency of qubit 3 can be adjusted by about 6% by changing a capacitance by about 3%. Therefore, in an embodiment, the resonance frequency of each of the one or more qubits (qubit 1, qubit 2, qubit 3) can be adjusted by a different amount depending on the size or the shape, or both, of the one or more cavities 501, 502 and 503.

Figure 6:
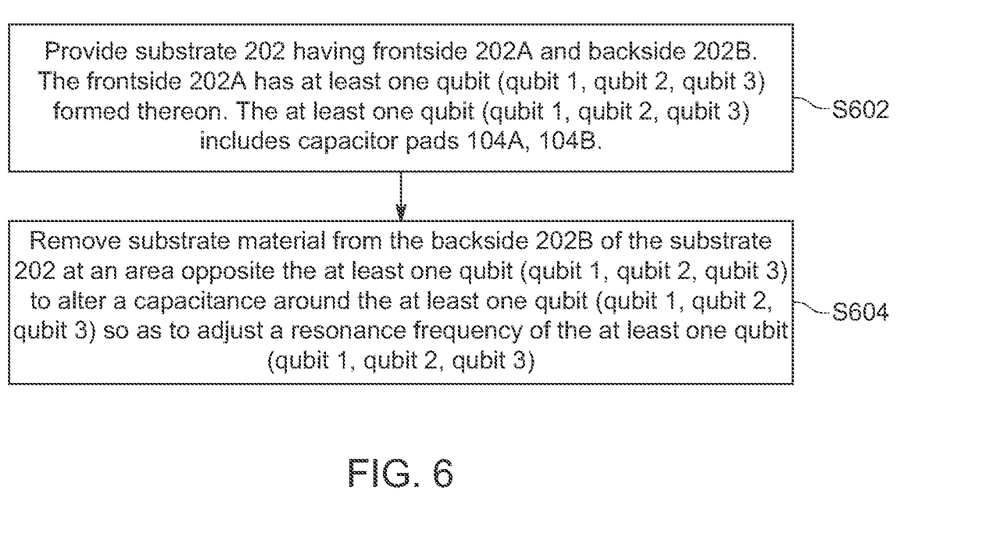
FIG. 6 is a flow chart of a method for adjusting a resonance frequency of qubits (e.g., qubit 1, qubit 2, qubit 3) in a quantum mechanical device, according to an embodiment of the present invention.

As it can be appreciated from the above paragraphs, there is also provided a method for adjusting a resonance frequency of a qubit (e.g., qubit 1, qubit 2, qubit 3) in a quantum mechanical device (e.g., quantum mechanical device 500). FIG. 6 is a flow chart of the method for adjusting a resonance frequency of the qubit (e.g., qubit 1, qubit 2, qubit 3) in the quantum mechanical device (e.g., quantum mechanical device 500), according to an embodiment of the present invention. The method includes providing substrate 202 having frontside 202A and backside 202B, at step S602. The frontside 202A has at least one qubit (qubit 1, qubit 2, qubit 3) formed thereon. The at least one qubit (qubit 1, qubit 2, qubit 3) includes capacitor pads 104A, 104B. The method further includes removing substrate material from the backside 202B of the substrate 202 at an area opposite the at least one qubit (qubit 1, qubit 2, qubit 3) to alter a capacitance around the at least one qubit (qubit 1, qubit 2, qubit 3) so as to adjust a resonance frequency of the at least one qubit (qubit 1, qubit 2, qubit 3), at step S604.

In an embodiment, removing the substrate material from the backside 202B of the substrate 202 at the area opposite the at least one qubit (qubit 1, qubit 2, qubit 3) includes chemically etching the backside 202B of the substrate 202 selectively using a chemical etchant selected depending on the substrate material (e.g., silicon, sapphire, etc.). In an embodiment, prior to chemically etching the backside 202B of the substrate 202, forming an initial cavity in the backside 202B of the substrate 202 in a vicinity of the at least one qubit (e.g., qubit 1, qubit 2, qubit 3) by mechanically removing material from the backside 202B of the substrate 202 and then chemically etching the backside 202B of the substrate 202 at the formed initial cavity.

Figure 7:
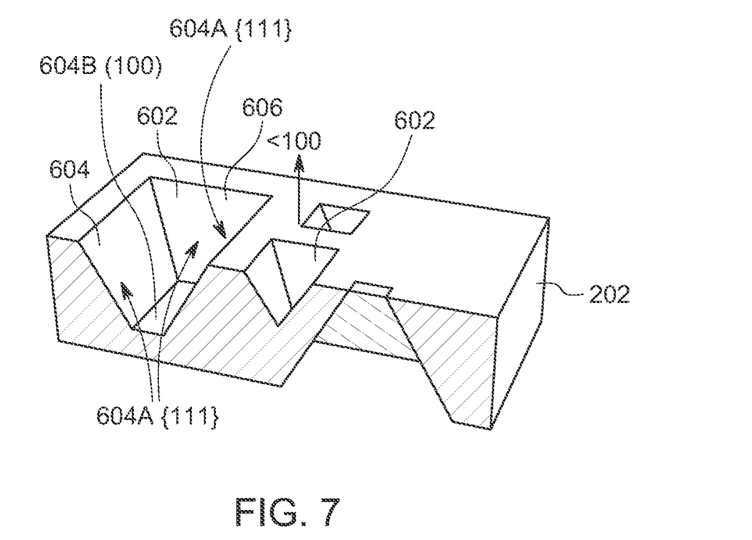
FIG. 7 is a schematic representation of an initial cavity formed on the backside of the substrate leading to a self-limiting anisotropic etch, according to an embodiment of the invention.

FIG. 7 is a schematic representation of an initial cavity 602 formed on the backside 202B of the substrate 202 leading to a self-limiting anisotropic etch, according to an embodiment of the invention. In an embodiment, forming the initial cavity 602 in the backside 202B of the substrate 202 includes defining faces 604 of the initial cavity 602 having one or more first crystal planes 604A (e.g., crystal plane (111)) and one or more second crystal planes 604B (e.g., crystal plane (100)) so that the chemical etchant preferentially etches the substrate material from the one or more first crystal planes 604A (e.g., crystal plane (111)) while substantially not etching the substrate material from the one or more second crystal planes 604B (e.g., crystal plane (100)) to form an etched final cavity 606 in the vicinity of the at least one qubit (not shown in FIG. 7). In this way, the etching is anisotropic as it etches preferentially one crystal plane over another crystal plane and is self-limiting because when the etchant reaches the less etchable crystal plane (second crystal plane), the etching automatically stops.

In an embodiment, the substrate material can be for example silicon in which case the one or more first crystal planes includes a (111) silicon crystal plane and the one or more second crystal planes includes a (100) silicon crystal plane. However, other crystal planes can be selected depending of the type of substrate material.

In an embodiment, the method includes controlling an amount of the substrate material etched by selecting a size and shape of the initial cavity (e.g., cavity 602) so that the etching of the substrate material stops when the one or more first crystal planes 604A (e.g., (111)-plane) are substantially eliminated so as to form size self-limited etched final cavities. In an embodiment, controlling the amount of material etched includes controlling an etching depth of the etched final cavities from the backside 202B to the frontside 202A of the substrate 202.

FIG. 8 depicts the backside 202B of the substrate 202 having a plurality of cavities 800, according to an embodiment of the present invention. For example, the size and/or the shape of the cavities can be controlled by selecting an appropriate shape for the initial cavities 602 (shown in FIG. 7). In this way, the etching of the substrate material stops when the one or more first crystal planes 604A (e.g., (111)-plane) are substantially eliminated so as to form size self-limited etched final cavities 800. A cross-section along line 5-5 of formed three cavities is shown in FIG. 5.

Figure 9:
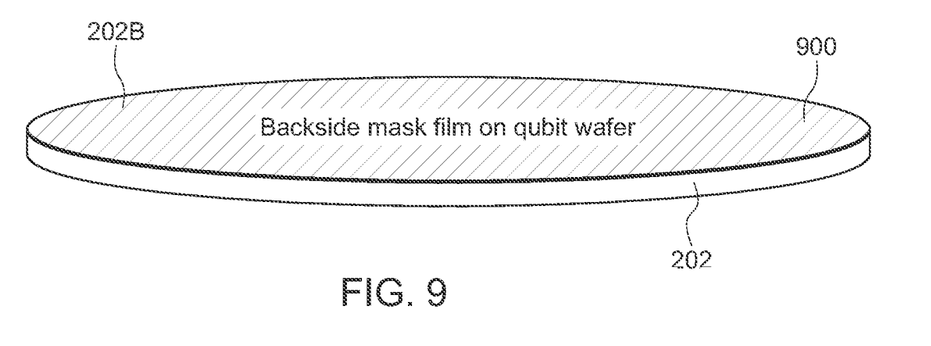
FIG. 9 shows a three-dimensional representation of an etch mask film applied to the backside of the substrate, according to an embodiment of the present invention.

In an embodiment, the removing the substrate material from the backside 202B of the substrate 202 at the area opposite the at least one qubit 100 (e.g., qubit 1, qubit 2, qubit 3) includes applying an etch mask film 900 to the backside 202B of the substrate 202 and etching selected areas at the backside 202B of the substrate 202 opposite the at least one qubit 100. FIG. 9 shows a three-dimensional representation of an etch mask film 900 applied to the backside 202B of the substrate, according to an embodiment of the present invention. In an embodiment, applying the etch mask film 900 to the backside 202B of the substrate 202 includes depositing niobium (Nb) on the backside 202B of the substrate 202. In another embodiment, applying the etch mask film 900 to the backside 202B of the substrate 202 includes depositing an oxide or silicon nitride (SiN) on the backside 202B of the substrate 202. In yet another embodiment, creating an etch mask includes oxidizing a silicon substrate 202 and removing an oxide layer on the frontside 202A of the silicon substrate 202.

Figure 10:
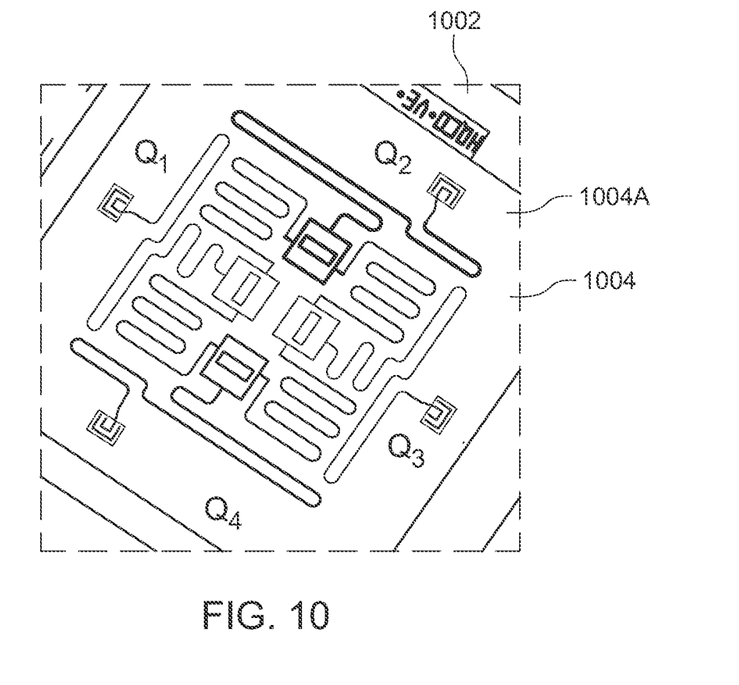
FIG. 10 shows an example micrograph image of a qubit chip having four qubits (qubit 1, qubit 2, qubit 3 and qubit 4), for example, on a frontside of a substrate of the qubit chip, according to an embodiment of the present invention.

In an embodiment, after applying or creating the etch mask 900 on the substrate 202, processing the substrate by performing aluminum evaporation on the frontside 202A of the substrate 202 to create the capacitor pads, the Josephson junction, etc. The backside coated processed substrate is then diced to create a plurality of chips 1002. A micrograph image is then taken of the frontside 202A of the diced qubit chip 1002 to register the locations of the qubits 100 (e.g., qubit 1, qubit 2, qubit 3) relative to the diced edges. FIG. 10 shows an example micrograph image of the qubit chip 1002 having four qubits (qubit 1, qubit 2, qubit 3 and qubit 4), for example, on frontside 1004A of substrate 1004 of qubit chip 1002, according to an embodiment of the present invention.

Figure 11:
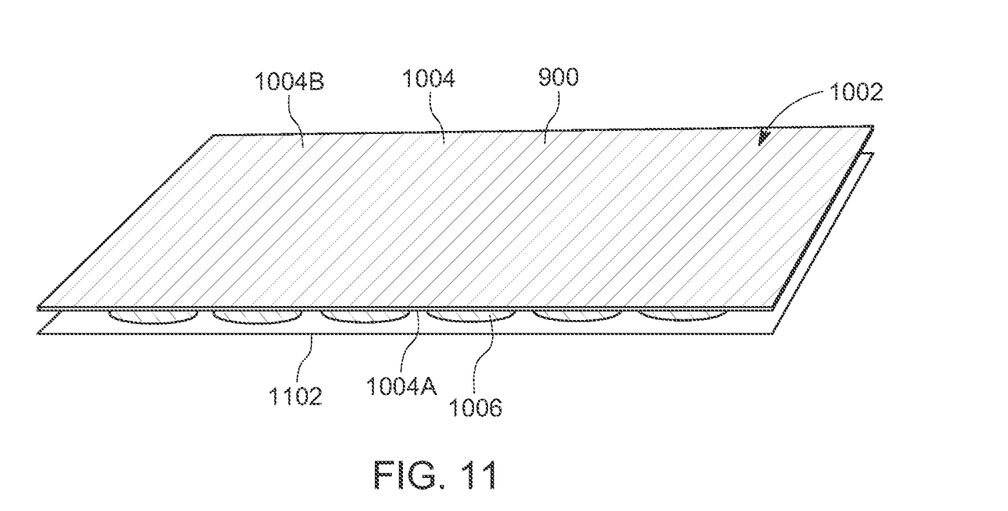
FIG. 11 is a schematic representation of a qubit chip bonded to interposer substrate with bump bonds, according to an embodiment of the present disclosure.

The method also includes bump-bonding the substrate 1004 of the qubit chip 1002 having the qubits (qubit 1, qubit 2, qubit 3 and qubit 4) to an interposer substrate 1102. FIG. 11 is a schematic representation of a qubit chip 1002 bonded to interposer substrate 1102 with bump bonds 1006, according to an embodiment of the present disclosure. The frontside 1004A of the substrate 1004 of the qubit chip 1002 having the qubits provided thereon faces the interposer substrate 1102 while the backside 1004B of the substrate 1004 of the qubit chip 1002 faces away from or opposite to the interposer substrate 1102.

Figure 12:
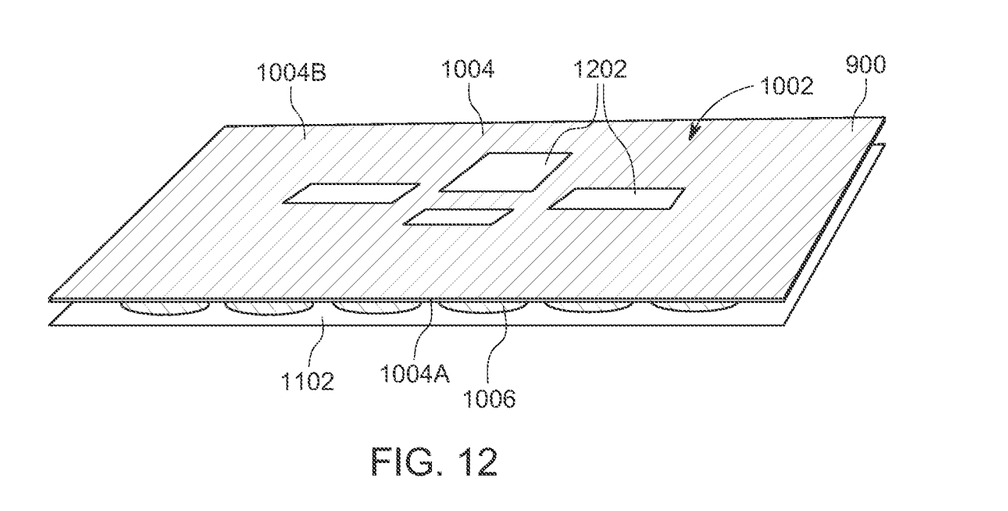
FIG. 12 is a schematic representation of the qubit chip bonded to an interposer substrate having one or more openings formed on the backside of the substrate, according to an embodiment of the present disclosure.

In an embodiment, the method also includes, subsequent to applying the etch film mask 900 to the backside 1004B of the substrate 1004 and prior to etching the selected areas at the backside 1004B of the substrate 1004, forming one or more openings 1202 in the etch film mask 900 at the selected areas. FIG. 12 is a schematic representation of the qubit chip 1002 bonded to interposer substrate 1102 having one or more openings 1202 formed on the backside 1004B of the substrate 1004, according to an embodiment of the present disclosure. In an embodiment, the one or more openings 1202 can be formed, for example, by using focused ion beam (FIB) etching, laser ablation, mechanical milling, or any combination thereof, or other etching methods.

Figures 13A, 13B, 13C:
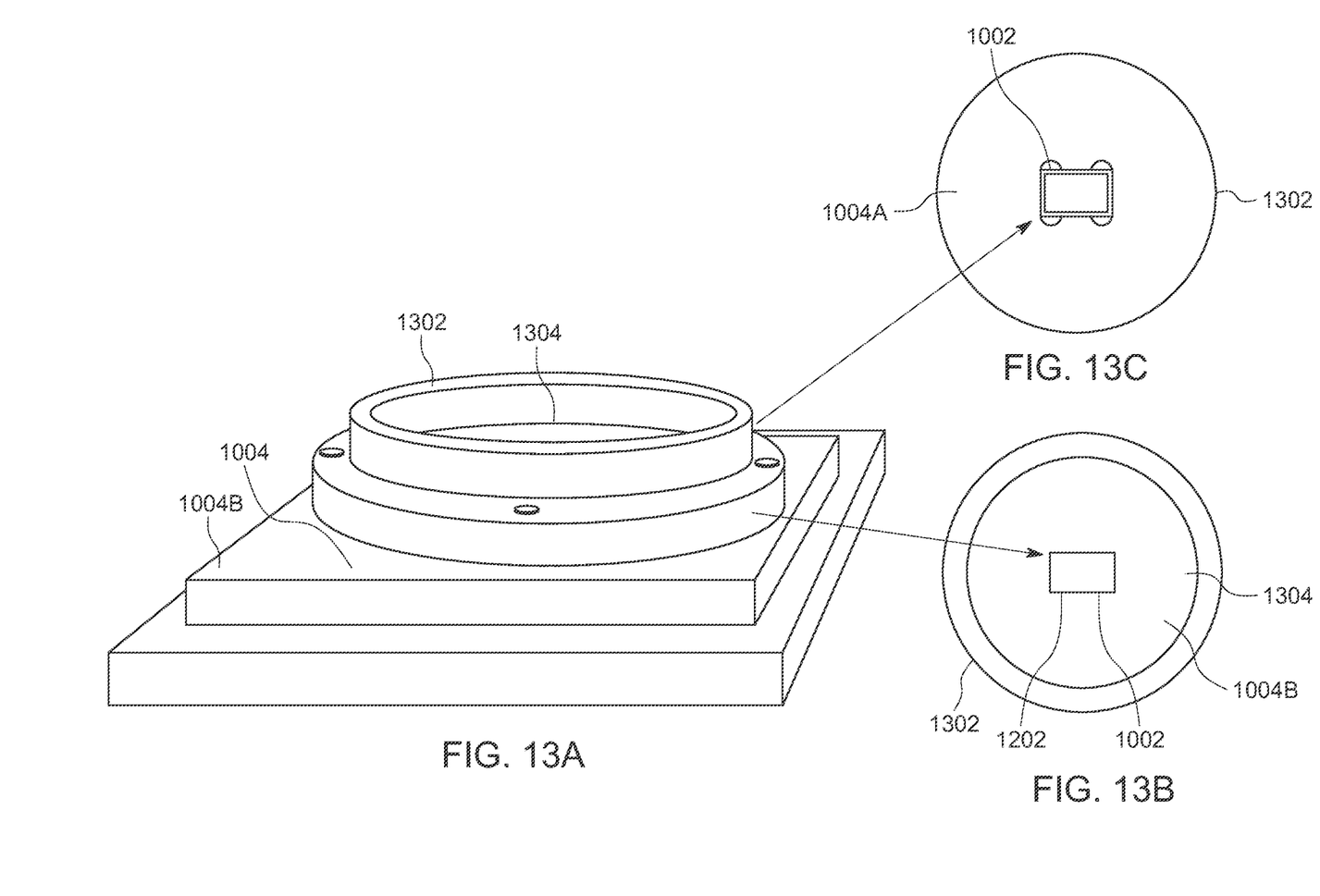
FIG. 13A is a schematic three-dimensional representation of a container deposited on the backside of the substrate to define an area around the one or more openings in the etch film mask, according to an embodiment of the present invention.
FIG. 13B is a schematic top view inside the container showing the relative position of the qubit chip and the one or more openings, according to an embodiment of the present invention.
FIG. 13C is a schematic view showing the position of the qubit chip relative to the container, the chip being positioned on the frontside of the substrate, according to an embodiment of the present invention.

In an embodiment, the method further includes disposing a chemical etchant container 1302 to define an area 1304 around the one or more openings 1202 in the etch film mask 900 and providing a wet or dry etching chemical to remove substrate material from the defined area 1304 at the one or more openings 1202 in the etch film mask 900 to form one or more cavities (such as cavities 501, 502, 503 shown in FIG. 5) at the backside 1004B of the substrate 1004. FIG. 13A is a schematic three-dimensional representation of container 1302 deposited on the backside 1004B of the substrate 1004 to define area 1304 around the one or more openings 1202 in the etch film mask 900, according to an embodiment of the present invention. FIG. 13B is a schematic top view inside the container 1302 showing the relative position of the qubit chip 1002 and the one or more openings 1202, according to an embodiment of the present invention. FIG. 13C is a schematic view showing the position of the qubit chip 1002 relative to the container 1302, the qubit chip being positioned on the frontside 1004A of the substrate 1004, according to an embodiment of the present invention.

In an embodiment, removing substrate material from the backside 1004B of the substrate 1004 at an area 1304 opposite the at least one qubit (qubit 1, qubit 2, . . . ) includes removing the substrate material from the backside 1004B of the substrate 1004 at a plurality of areas 1304 opposite to a plurality of qubits to form a plurality of cavities on the backside 1004B of the substrate 1004. In an embodiment, removing the substrate material from the backside 1004B of the substrate 1004 at the plurality of areas opposite to the plurality of qubits includes removing the substrate material from the backside 1004B of the substrate 1004 at the plurality of areas 1304 opposite to the plurality of qubits substantially simultaneously using a global substrate etch process. In an embodiment, the global etch process includes applying a chemical etch process. For example, the chemical etchant can be poured into the chemical etchant container 1302 to etch the substrate at the one or more openings 1202.

In an embodiment, the method further includes controlling an amount of material etched by selecting a size and shape of a formed initial cavity for each of the plurality of areas so that the etching of the substrate material stops at different times depending upon a selected geometry or shape of the initial opening (for example as shown in FIG. 7). In an embodiment, forming the initial cavity includes defining faces of the initial cavity having one or more first crystal planes and one or more second crystal planes in the substrate material so that the substrate material is etched from the one or more first crystal planes while substantially not etched from the one or more second crystal planes, as described in the above paragraphs.

The above backside etching method has many benefits including: 1) individual qubits can be independently frequency tuned, for example, by using varying degrees of backside substrate removal at a proximity of each qubit thereby changing qubit capacitance by different amounts; 2) individual qubits can be independently frequency tuned using a global substrate etch process; 3) backside etching enables qubit operational specifications to be modified with substantially less perturbation or minimal perturbation to the environment of the qubit; 4) qubit frequency tuning after bump bonding or packaging of the chip is enabled, thus allowing fine tuning the qubit specifications after packaging has taken place which enables a more reliable and controllable end product for optimal device performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A quantum mechanical device, comprising:
 a substrate having a frontside and a backside, the frontside having at least one qubit formed on the frontside, and the at least one qubit comprising a first capacitor pad and a second capacitor pad having a gap reserved between the first capacitor pad and the second capacitor pad,
 wherein the substrate comprises at least an area below the gap to form a trench, wherein a base of the trench is wider than the gap and extends under an entirety of the gap to alter a capacitance around the at least one qubit so as to adjust a resonance frequency of the at least one qubit.

2. The quantum mechanical device of claim 1, wherein a size of the one or more cavities are selected to alter a capacitance around the at least one qubit so as to adjust a resonance frequency of the at least one qubit.

3. The quantum mechanical device of claim 1, wherein a shape of the one or more cavities are selected to alter a capacitance around the at least one qubit so as to adjust a resonance frequency of the at least one qubit.

4. The quantum mechanical device of claim 1, wherein a size and a shape of the one or more cavities are selected to alter a capacitance around the at least one qubit so as to adjust a resonance frequency of the at least one qubit.

5. The quantum mechanical device according to claim 1, wherein the substrate is selected from the group consisting of silicon, high resistivity silicon, and sapphire.

6. The quantum mechanical device according to claim 2, wherein the first capacitor pad and the second capacitor pad are made from a superconducting material.

7. The quantum mechanical device according to claim 6, wherein the superconducting material is selected from the group consisting of aluminum (Al) and niobium (Nb).

8. The quantum mechanical device according to claim 1, wherein the resonance frequency of the at least one qubit is adjusted by 0.2% to 20%.

9. The quantum mechanical device according to claim 1, wherein the resonance frequency of each of the at least one qubit is adjusted by a different amount depending on the size or the shape, or both, of the one or more cavities trench.

10. A quantum mechanical device, comprising:
 a substrate having a frontside and a backside, the frontside having a plurality of qubits formed on the frontside, and each of the plurality of qubits comprising respective capacitor pads of a plurality of capacitor pads, adjacent ones of the respective capacitor pads having a respective gap reserved therebetween
 wherein the substrate comprises at least an area below the respective gap to form a trench, wherein a base of the trench is wider than the gap and extends under an entirety of the gap to alter a capacitance around the plurality of qubits so as to adjust a resonance frequency of the plurality of qubits.

11. The quantum mechanical device according to claim 10, wherein the dimension of the trench comprises a size and a shape.

12. The quantum mechanical device according to claim 10, wherein the resonant frequency of the plurality of qubits is adjusted based on altering the size of the trench.

13. The quantum mechanical device according to claim 10, wherein the resonant frequency of the plurality of qubits is adjusted based on altering the shape of the trench.

14. The quantum mechanical device according to claim 10, wherein the resonant frequency of the plurality of qubits is adjusted based on altering the size and the shape of the trench.

15. The quantum mechanical device of claim 10, further comprising a second trench below a second gap between a second set of plurality of qubits, and wherein the two cavities trench and the second trench are triangular trenches.

16. The quantum mechanical device of claim 15, further comprising a third trench below a third gap between a third set of plurality of qubits, and wherein the trench and the second trench are triangular trenches and the third trench is a trapezoid trench.

17. The quantum mechanical device of claim 15, wherein the modification of the capacitance of one of the plurality of qubits is about 1% by forming one of the triangular trenches and modification of the capacitance of another one of the plurality of qubits is about 3% by forming another of the triangular trenches.

18. The quantum mechanical device of claim 16, wherein the modification of the capacitance of one of the plurality of qubits is about 1% by forming one of the triangular trenches and modification of the capacitance of another one of the plurality of qubits is about 3% by forming another of the triangular trenches and modification of the capacitance of another one of the qubits is about 20% by forming the trapezoid trench.

\* \* \* \* \*